US 10,439,084 B2

(12) United States Patent
Eickelmann et al.

(10) Patent No.: US 10,439,084 B2
(45) Date of Patent: Oct. 8, 2019

(54) ENERGY HARVESTING DEVICE WITH PREFABRICATED THIN FILM ENERGY ABSORPTION SHEETS AND ROLL-TO-SHEET AND ROLL-TO-ROLL FABRICATION THEREOF

(71) Applicant: International Business Machines Corporation, Armonk, NY (US)

(72) Inventors: Hans-Juergen Eickelmann, Mainz (DE); Ruediger Kellman, Mainz (DE); Hartmut Kuehl, Mainz (DE); Markus Schmidt, Mainz (DE)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 14/728,670

(22) Filed: Jun. 2, 2015

(65) Prior Publication Data

US 2016/0359066 A1   Dec. 8, 2016

(51) Int. Cl.
*H01L 31/0465* (2014.01)
*H01L 31/0224* (2006.01)
(Continued)

(52) U.S. Cl.
CPC .... *H01L 31/0465* (2014.12); *H01L 31/02245* (2013.01); *H01L 31/022458* (2013.01);
(Continued)

(58) Field of Classification Search
CPC . H01L 31/0465; H01L 31/0224; H01L 31/18; H01L 31/046–0463; H01L 31/0687; H01L 31/0725; H01L 31/076; H01L 31/1884; H01L 31/02245; H01L 31/022466; H01L 31/022458; Y02E 10/50
(Continued)

(56) References Cited

U.S. PATENT DOCUMENTS

| | | | | |
|---|---|---|---|---|
| 7,587,864 B2 * | 9/2009 | McCaskill | | E04D 1/205 |
| | | | | 136/243 |
| 2007/0283999 A1 * | 12/2007 | Yekutiely | | H01L 31/042 |
| | | | | 136/259 |

(Continued)

FOREIGN PATENT DOCUMENTS

| | | | | |
|---|---|---|---|---|
| JP | WO2014054271 | * | 4/2014 | ........... H02M 3/155 |
| WO | 2014021948 A1 | | 2/2014 | |

OTHER PUBLICATIONS

Filed Jun. 2, 2015.
(Continued)

*Primary Examiner* — Liesl C Baumann
(74) *Attorney, Agent, or Firm* — Jared C. Chaney

(57) ABSTRACT

An energy harvesting device includes prefabricated thin film energy absorption sheets that are each tuned to absorb electromagnetic energy of a corresponding wavelength. The energy harvesting device can include a prefabricated thin film converter sheet to convert the electromagnetic energy into electrical power. The energy harvesting device can include a prefabricated thin film battery sheet to store the electrical power. Each thin film energy absorption sheet can be fabricated using a roll-to-roll process. The energy harvesting device can be fabricated using a roll-to-sheet process from rolls of the thin film energy absorption sheets.

2 Claims, 6 Drawing Sheets

(51) Int. Cl.
*H01L 31/0725* (2012.01)
*H01L 31/18* (2006.01)
(52) U.S. Cl.
CPC .. *H01L 31/022466* (2013.01); *H01L 31/0725* (2013.01); *H01L 31/1884* (2013.01); *Y02E 10/50* (2013.01)
(58) Field of Classification Search
USPC .................................................. 136/243–265
See application file for complete search history.

(56) References Cited

U.S. PATENT DOCUMENTS

| | | | | |
|---|---|---|---|---|
| 2009/0020149 | A1* | 1/2009 | Woods | H01L 21/385 136/244 |
| 2010/0126573 | A1* | 5/2010 | Youtsey | H01L 31/022441 136/255 |
| 2010/0170556 | A1* | 7/2010 | Frolov | H01L 31/042 136/244 |
| 2011/0041890 | A1* | 2/2011 | Sheats | H01L 31/022433 136/244 |
| 2011/0041899 | A1* | 2/2011 | Josell | H01L 21/02562 136/255 |
| 2011/0239450 | A1 | 10/2011 | Basol et al. | |
| 2012/0097215 | A1* | 4/2012 | Vermeersch | H01L 31/02008 136/246 |
| 2012/0204939 | A1* | 8/2012 | Lee | H01L 31/0749 136/249 |
| 2013/0146120 | A1 | 6/2013 | Seel et al. | |
| 2014/0030841 | A1 | 1/2014 | Armstrong et al. | |
| 2014/0106500 | A1 | 4/2014 | Van Duren et al. | |
| 2015/0244312 | A1* | 8/2015 | Nakaya | H02J 3/385 136/246 |

OTHER PUBLICATIONS

Filed Aug. 14, 2013, U.S. Appl. No. 13/966,516, 2015-0047686.
Filed Jan. 5, 2015, U.S. Appl. No. 14/589,233.
Bullis, "Exotic, Highly Efficient Solar Cells May Soon Get Cheaper", MIT Technology Review, Jun. 9, 2014, 2 pp.
Markowitz et al., "Multijunction photovoltaic cell", Wikipedia, accessed online Apr. 20, 2015, <http://en.wikipedia.org/wiki/Multijunction%20photovoltaic%20cell?oldid=647853596>, 11 pp.
List of IBM Patents or Patent Applications Treated as Related dated Nov. 16, 2015.

* cited by examiner

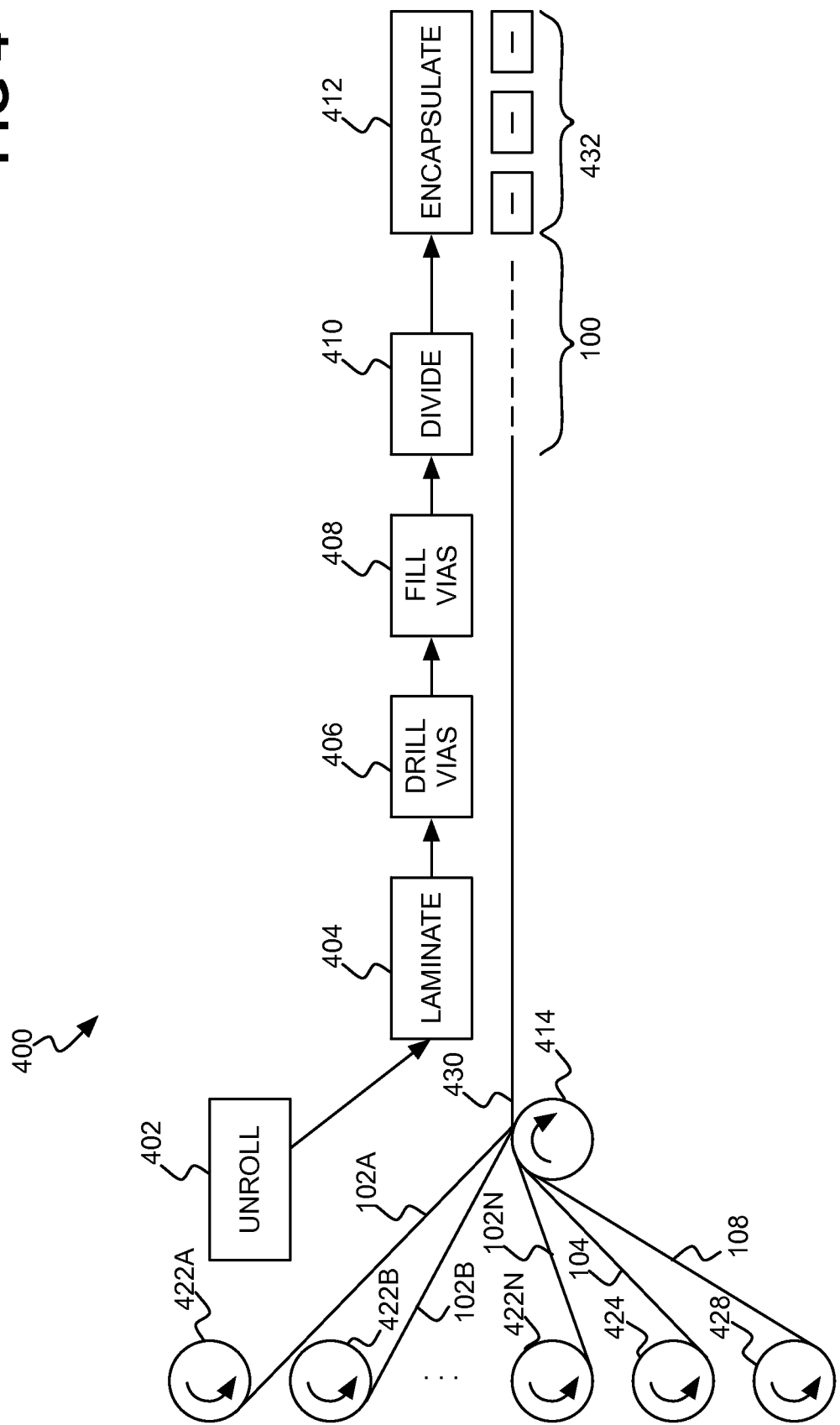

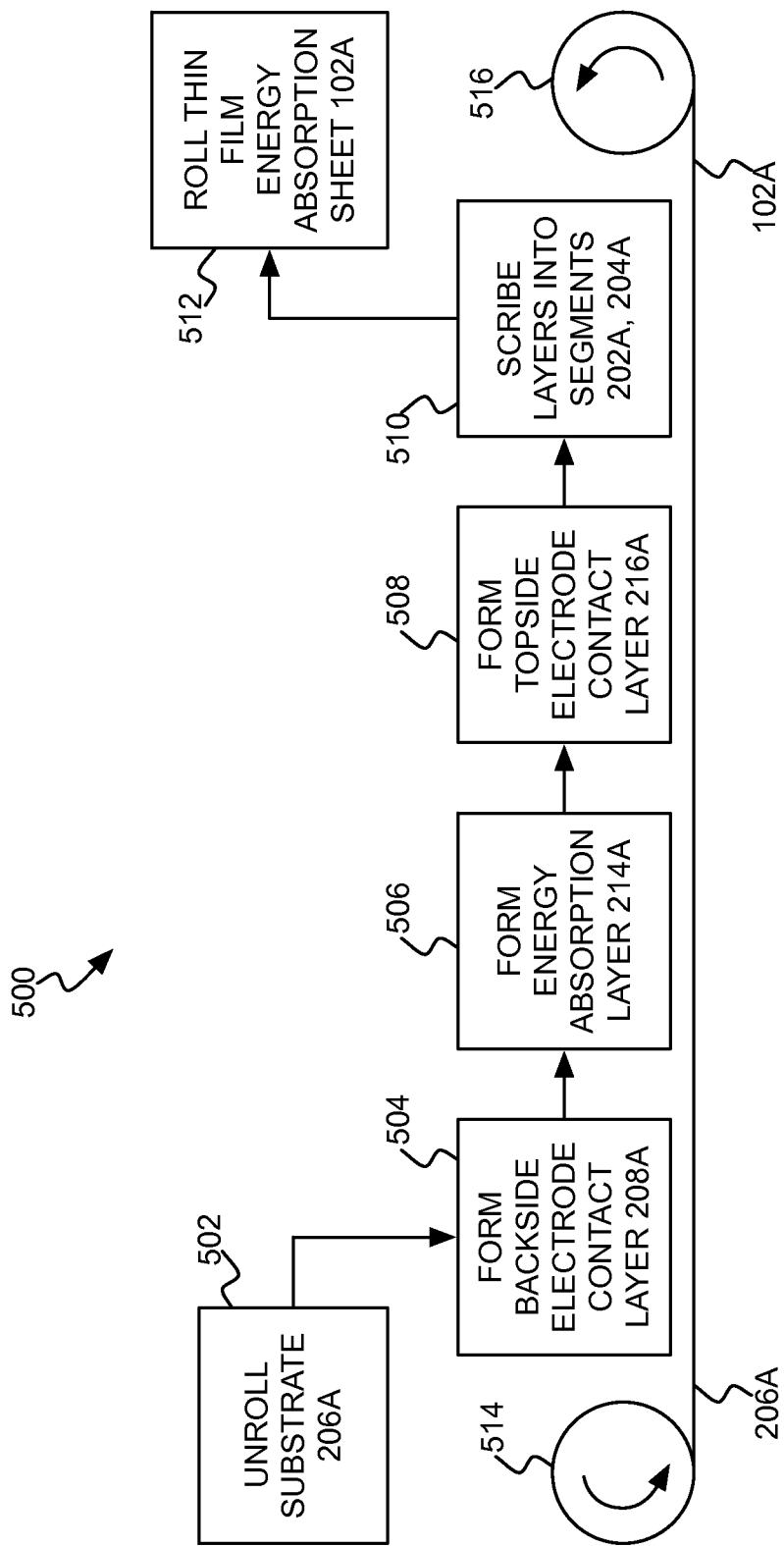

ENERGY HARVESTING DEVICE WITH PREFABRICATED THIN FILM ENERGY ABSORPTION SHEETS AND ROLL-TO-SHEET AND ROLL-TO-ROLL FABRICATION THEREOF

BACKGROUND

Electronic devices widely vary in size, shape, and functionality, but all share a common need for electrical power. Typical powering schemes include plugging in the devices to alternating current (AC) mains via a wall outlet, as well as using batteries that may be recharged by similarly being plugged into AC mains. More recently, solar cells have become an approach by which electronic devices can be powered by converting solar energy into electrical energy.

SUMMARY

An example energy harvesting device includes a backplane sheet. The device includes prefabricated thin film energy absorption sheets attached to the backplane sheet and organized in a stack from a top sheet to a bottom sheet. Each energy absorption sheet is attached to at least one other energy absorption sheet. Each energy absorption sheet includes an energy absorption layer tuned to absorb electromagnetic energy of a corresponding wavelength, and one or more electrode contact layers in contact with the energy absorption layer. The energy harvesting device includes pairs of vias corresponding to the energy absorption sheets. Each pair of vias is filled with a conductive material, and extends from the backplane sheet through the stack to the electrode contact layers of a corresponding energy absorption sheet.

An example roll-to-sheet method for fabricating energy harvesting devices includes unrolling prefabricated thin film sheets, including prefabricated thin film energy absorption sheets, from corresponding rolls of the prefabricated thin film sheets into which the prefabricated thin film sheets have been wound. The method includes laminating the thin film sheets together after unrolling, and drilling vias through the thin film sheets after lamination. The method includes filling the vias with a conductive material, and dividing the thin film sheets into the energy harvesting devices after drilling and filling the vias. The thin film energy absorption sheets absorb electromagnetic energy.

An example roll-to-roll method for fabricating a thin film energy absorption sheet includes unrolling a thin film substrate from a roll, and forming an energy absorption layer on the thin film substrate after unrolling, the energy absorption layer tuned to absorb electromagnetic energy of a corresponding wavelength. The method includes forming one or more electrode contact layers on the thin film substrate after unrolling. The energy absorption layer and the electrode contact layers are in contact with one another. The method includes rolling the thin film substrate with the energy absorption layer and the electrode contact layers formed thereon into a roll of the thin film energy absorption sheet.

BRIEF DESCRIPTION OF THE DRAWINGS

The drawings referenced herein form a part of the specification. Features shown in the drawing illustrate only some embodiments of the disclosure, and not of all embodiments of the disclosure, unless the detailed description explicitly indicates otherwise, and readers of the specification should not make implications to the contrary.

FIG. 4 is an illustrative flowchart of an example roll-to-sheet method for fabricating multiple energy harvesting devices.

FIG. 5 is an illustrative flowchart of an example roll-to-roll method for fabricated a thin film energy absorption sheet.

DETAILED DESCRIPTION

The following detailed description of exemplary embodiments of the disclosure refers to the accompanying drawings that form a part of the description. The drawings illustrate specific exemplary embodiments in which the disclosure may be practiced. The detailed description, including the drawings, describes these embodiments in sufficient detail to enable those skilled in the art to practice the disclosure. Those skilled in the art may further utilize other embodiments of the disclosure, and make logical, mechanical, and other changes without departing from the spirit or scope of the disclosure.

As noted in the background section, solar cells are one way to power electronic devices. Historically, solar cells have suffered from two primary deficiencies. First, their efficiency at converting electromagnetic energy to electrical energy that can be used to power devices has been relatively low. Second, the fabrication of such solar cells has been relatively difficult and expensive. Both of these deficiencies have limited the extent to which solar cells have been integrated into electronic devices.

Disclosed herein is an energy harvesting device. The device is an energy harvesting device in that it harvests energy, such as electromagnetic energy from the sun or other visible light sources, so that the energy can be used for other applications, such as the powering of electronic devices. The energy harvesting device includes a backplane sheet to which prefabricated thin film sheets, including prefabricated thin film energy absorption sheets, are attached.

The thin film energy absorption sheets are organized in a stack, and each sheet is tuned to absorb electromagnetic energy of a corresponding wavelength, such as the same or different wavelengths of visible light. A roll-to-roll fabrication technique can be used to fabricate each individual thin film energy absorption sheet, and a roll-to-sheet fabrication technique can be used to fabricate energy harvesting devices from such prefabricated sheets. Other prefabricated thin film energy absorption sheets that can be integrated within the energy harvesting devices include the backplane sheet, thin film power converter sheets, thin film battery sheets, and/or combined thin film power converter-battery sheets. As described below, these techniques overcome the deficiencies with existing solar cells.

Figure 1A:
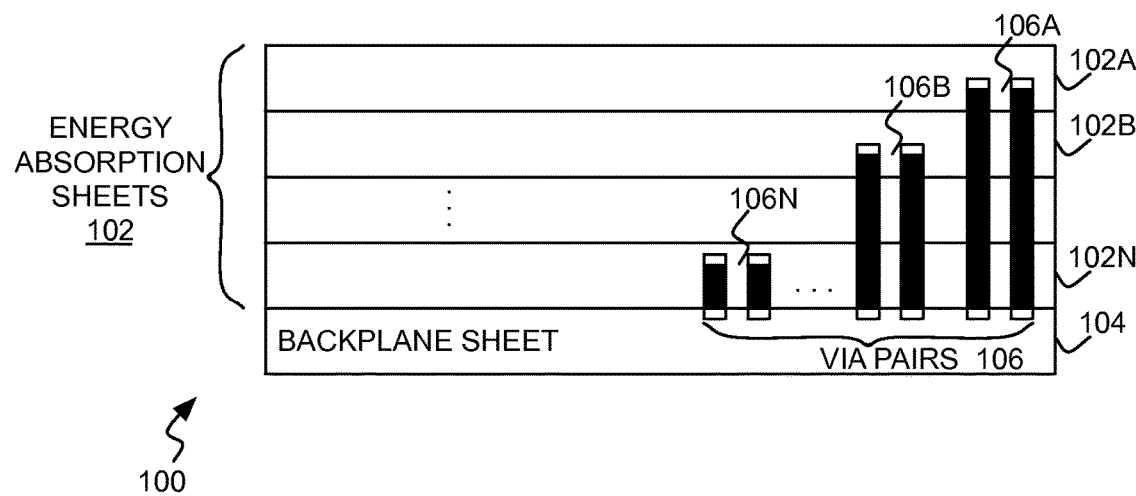
FIGS. 1A and 1B are diagrams of example energy harvesting devices.
Figure 1B:
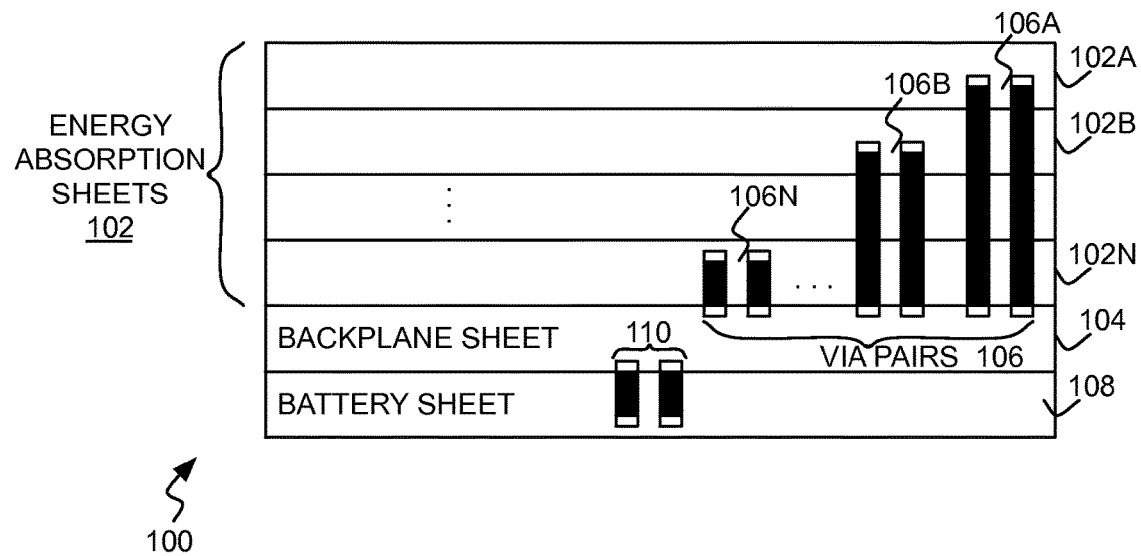

FIGS. 1A and 1B show an example energy harvesting device 100. The energy harvesting device 100 includes prefabricated thin film energy absorption sheets 102. The energy absorption sheets 102 include individual such sheets 102A, 102B, . . . , 102N. There are at least two energy absorption sheets 102. The energy absorption sheets 102 are organized in a stack from the top sheet 102A to the bottom sheet 102N. As depicted in FIGS. 1A and 1B, each energy absorption sheet 102 is attached to at least one other energy absorption sheet 102. Each energy absorption sheet 102 absorbs electromagnetic energy of a corresponding wavelength.

The energy harvesting device 100 can include a prefabricated thin film backplane sheet 104 attached to the bottom energy absorption sheet 102N. In the examples of both FIGS. 1A and 1B, the backplane sheet 104 can be a power converter sheet. The power converter sheet converts the electromagnetic energy absorbed by the energy absorption sheets 102 into electrical power. In the example of FIG. 1A, the backplane sheet 104 can be a combined power converter-battery sheet, which both converts the electromagnetic energy absorbed by the energy absorption sheets 102 into electrical power and stores the electrical power.

In the example of FIG. 1B, by comparison, there is a separate prefabricated thin film battery sheet 108 attached to the backplane sheet 104, and which stores the electrical power generated by the backplane sheet 104. An example of a backplane sheet 104 that is a power converter sheet is described in US published patent application number 2015/0047686. An example of a battery sheet 108 is described in the U.S. patent application having the application Ser. No. 14/589,233.

The energy harvesting device 100 includes conductive material-filled via pairs 106 corresponding to the energy absorption sheets 102. The via pairs 106 include via pairs 106A, 106B, . . . , 106N that correspond to the energy absorption sheets 102A, 102B, . . . , 102N, respectively. Each via pair 106 includes two vias that are conductively connected to the backplane sheet, extend from the backplane sheet 104, and conductively connect to a corresponding energy absorption sheet 102. Each via pair 106 is not conductively connected to any intermediate energy absorption sheet 102 between the backplane sheet 104 and its corresponding energy absorption sheet 102. Each via is filled with a conductive material, such as a metallic material like copper, aluminum, or an alloy, among others, or a non-metallic conductive material that is at least substantially transparent. The via pairs 106 permit the energy absorbed by the energy absorption sheets 102 to be routed to the backplane sheet 104.

In the example of FIG. 1B, there is also a conductive material-filled via pair 110 for the battery sheet 108. The via pair 110 includes two vias that are conductively connected to the backplane sheet, extend from the backplane sheet 104, and conductively connect to the battery sheet 108. Each via is filled with a conductive material. The via pair 110 permits the electrical energy generated by the backplane sheet 104 to be routed to the battery sheet 108.

Figure 2A:
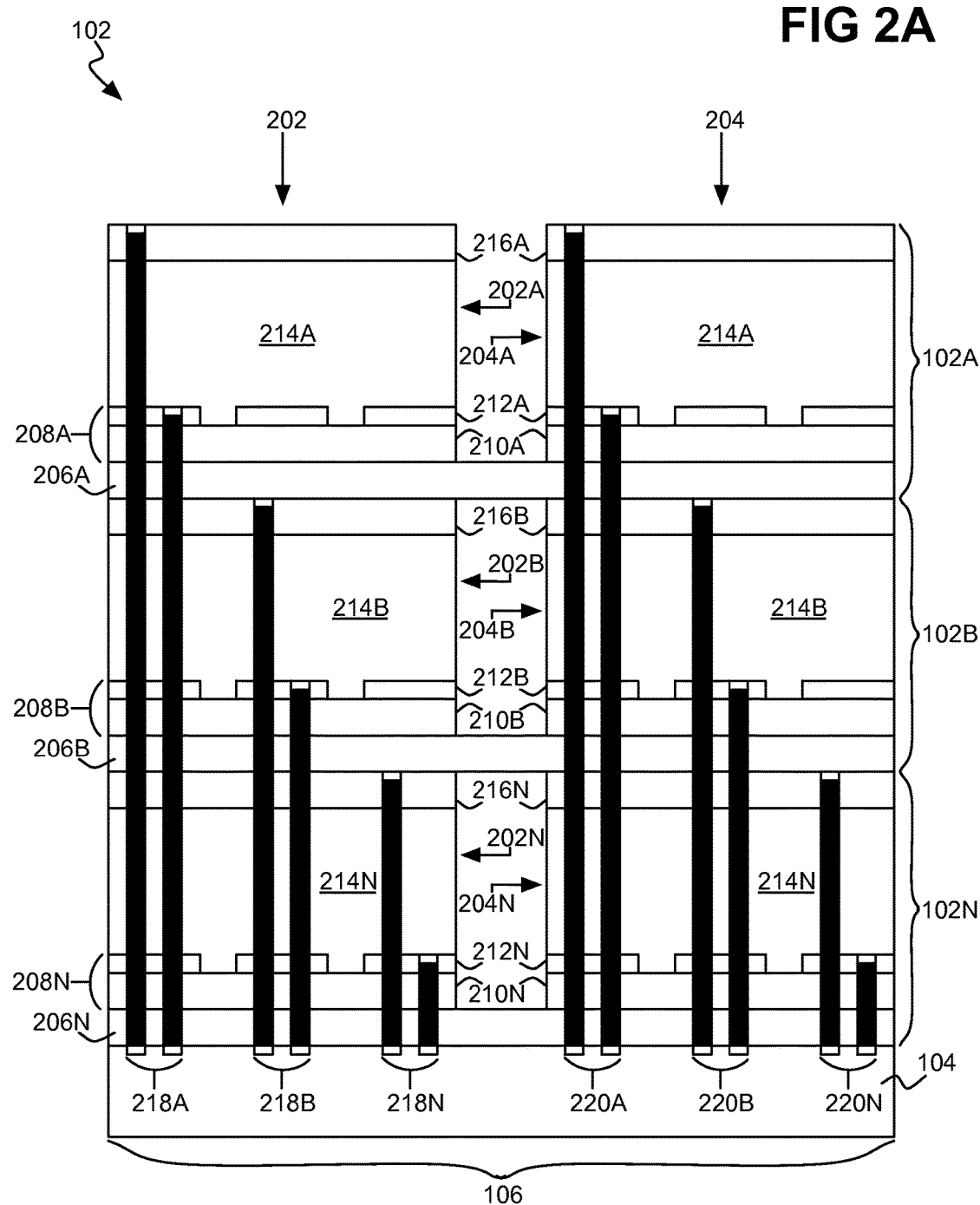
FIGS. 2A and 2B are diagrams of example prefabricated thin film energy absorption sheet stacks.

FIG. 2A shows an example of the prefabricated thin film energy absorption sheets 102 of the energy harvesting device 100. The backplane sheet 104 is also depicted in FIG. 2A, and in another implementation, the device 100 can include the battery sheet 108 as well. There are three energy absorption sheets 102A, 102B, and 102N, which can absorb electromagnetic energy of the same or different corresponding wavelengths. For example, the energy absorption sheets 102A, 102B, and 102N can absorb electromagnetic energy of blue, green, and red visible light wavelengths, respectively.

The energy absorption sheets 102 are segmented into two energy absorption cells 202 and 204. In other implementations, there can be more than two energy absorption cells. The sheet 102A is segmented into cells 202A and 204A; the sheet 102B is segmented into cells 202B and 204B; and the sheet 102N is segmented into cells 202N and 204N. In one implementation, the backplane sheet 104 can include a separate power converter device for each energy absorption cell 202 and 204. Therefore, if one cell 202 or 204 becomes damaged, it will not affect the other, undamaged cell 204 or 202.

The energy absorption sheets 102A, 102B, and 102N have corresponding backside layers 206A, 206B, and 206N, respectively. The backside layers 206A, 206B, and 206N are substrate layers, and may have a thickness between fifty and one-hundred micrometers. The backside layers 206A, 206B, and 206N may be glass foil or another material. In the example of FIG. 2, no backside layer is adjacent any other backside layer.

The energy absorption sheets 102A, 102B, and 102N have bottom, or backside, electrode contact layers 208A, 208B, and 208N, respectively. The electrode contact layers 208A, 208B, and 208N may be a substantially transparent structured metal nanowire layer. For example, the electrode contact layer 208A can include a transparent insulating layer 210A on or within which a conductive wire network layer 212A is formed. Likewise, the electrode contact layer 208B can include a transparent insulating layer 210B and a conductive wire network layer 212B, and the electrode contact layer 208N can include a transparent insulating layer 210N and a conductive wire network layer 212N.

The transparent insulating layers 210A, 210B, and 210N may be aluminum oxide, an ultraviolet (UV)-cured polymer material, or another type of material. The conductive wire network layers 212A, 212B, and 212N may be molybdenum, silver, copper, aluminum, or another type of material. In another implementation, the bottom electrode contact layers 208A, 208B, and 208N are a transparent conductive material like a transparent conductive oxide (TCO) such as indium tin oxide (ITO) or zinc oxide with aluminum, instead of transparent insulating layers 210A, 210B, and 210N on or within which conductive wire network layers 212A, 212B, and 212N are formed.

The energy absorption sheets 102A, 102B, and 102N have energy absorption layers 214A, 214B, and 214N, respectively. The energy absorption layers 214A, 214B, and 214N are tuned to absorb electromagnetic energy of corresponding wavelengths. The energy absorption layers 214A, 214B, and 214N are semiconductive materials, such as gallium arsenide, indium phosphide, indium gallium phosphide, indium gallium arsenide, germanium, or another type of semiconductive material. For instance, other types of semiconductive materials include copper indium gallium selenide (CIGS), copper zinc tin sulfide (CZTS), and cadmium magnesium telluride, among others. Still other types of semiconductive materials that can be employed include organic-inorganic perovskite, and other organic photovoltaic materials that can be tuned to a desired absorption wavelength. The semiconductive materials may be grown using epitaxial growth, vacuum deposition, electroplating, inkjet printing, and transfer-bonding crystalline thin film processes, among others.

The energy absorption sheets 102A, 102B, and 102N have top, or topside, electrode contact layers 216A, 216B, and 216N, respectively. The electrode contact layers 216A, 216B, and 216N may be a transparent conductive material like a TCO such as ITO or zinc oxide with aluminum. In another implementation, the top electrode contact layers 216A, 216B, and 216N may be transparent insulating layers on or within which conductive wire network layers are formed. In the example of FIG. 2A, the energy absorption sheets 214A, 214B, and 214N are in contact with and disposed between the bottom electrode contact layers 208A, 208B, and 208N and the top electrode contact layers 216A, 216B, and 216N.

The via pairs 106 that have been described include two via pairs for each energy absorption sheet 102A, 102B, and 102N, in correspondence with the number of energy absorption cells 202 and 204. Stated another way, there are separate via pairs 106 for each energy absorption sheet 102A, 102B, and 102N of each energy absorption cell 202 and 204. Specifically, there are via pairs 218A, 218B, and 218N for the energy absorption cells 202A, 202B, and 202N, respectively. Similarly, there are via pairs 220A, 220B, and 220N for the energy absorption cells 204A, 204B, and 204N, respectively.

Each via pair includes one via that extends from the backplane sheet 104 and conductively connects to the bottom electrode contact layer of a corresponding energy absorption sheet, and another via that extends from the bottom of the energy absorption sheets to the top electrode contact layer of this corresponding energy absorption sheet. The via pair 218A is described as representative of the other via pairs 218B, 218N, 220A, 220B, and 220N in this respect. The right via of the via pair 218A extends from the backplane sheet 104 and conductively connects to the bottom electrode contact layer 212A of the energy absorption sheet 102A. The left via of the via pair 218A extends from the backplane sheet 104 and conductively connects to the top electrode contact layer 216A of the energy absorption sheet 102A.

Figure 2B:
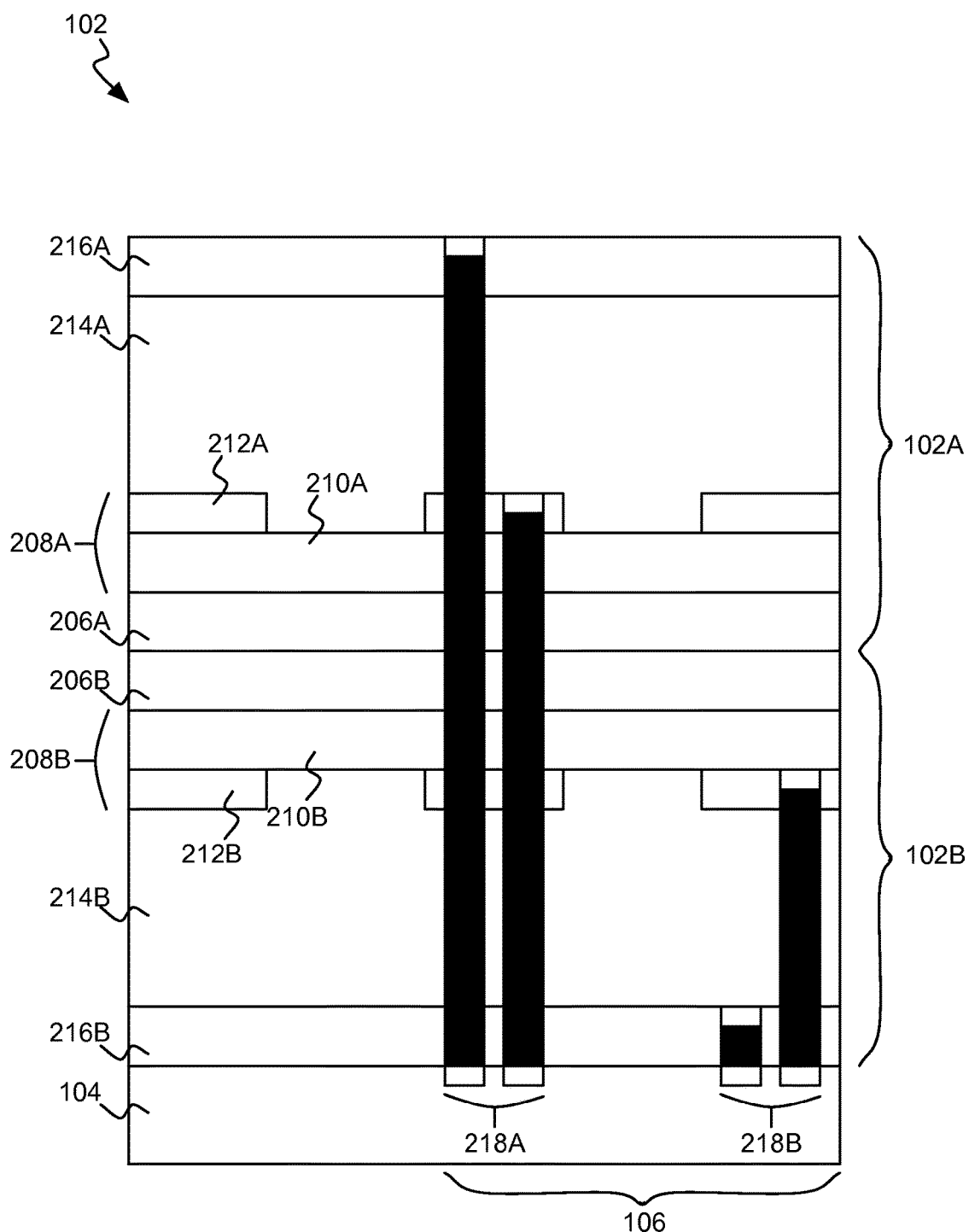

FIG. 2B shows another example of the prefabricated thin film energy absorption sheets 102 of the energy harvesting device 100. The backplane sheet 104 is also depicted in FIG. 2B, and in another implementation, the device can include the battery sheet 108 as well. There are two energy absorption sheets 102A and 102B that can absorb electromagnetic energy of the same or different corresponding wavelengths. For example, the energy absorption sheets 102A and 102B may absorb electromagnetic of blue and red visible light wavelengths, respectively.

The energy absorption sheets 102A and 102B are organized in a tandem configuration, in which the backside layer 206A of the sheet 102A and the backside layer 206B of the sheet 102B are directly adjacent one another. Otherwise, the energy absorption sheets 102A and 102B are as have been described in relation to FIG. 2A. The energy absorption sheets 102A and 102B have bottom electrode contact layers 208A and 208B, respectively, which may be a substantially transparent structured metal nanowire layer. The electrode contact layer 208A thus can include the transparent insulating layer 210A on or within which the conductive wire network layer 212A is formed, and the electrode contact layer 208B can include the transparent insulating layer 210B on or within which the conductive wire network layer 212B is formed.

The energy absorption sheets 102A and 102B have energy absorption layers 214A and 214B, respectively, which are tuned to absorb electromagnetic energy of corresponding wavelengths. The energy absorption sheets 102A and 102B have top electrode contact layers 216A and 216B, respectively, which may be a transparent conductive material. The via pairs 106 include the via pairs 218A and 218B corresponding to the energy absorption sheets 102A and 102B, respectively. The via pair 218A is conductively connected to the backplane sheet 104, extend from the backplane sheet 104, and conductively connect to the energy absorption sheet 102A. Specifically, the via pair 218A includes one via that conductively connects to the top electrode contact layer 216A and another via that conductively connects to the bottom electrode contact layer 208A. The via pair 218B is conductively connected to the backplane sheet 104, extend from the backplane sheet 104, and conductively connected to the energy absorption sheet 102B. Specifically, the via pair 218B includes one via that conductively connects to the top electrode contact layer 216B and another via that conductively connects to the bottom electrode contact layer 208B.

The tandem configuration of FIG. 2B can be segmented like the non-tandem configuration of FIG. 2A in another implementation. Similarly, the non-tandem configuration of FIG. 2A may not be segmented like the tandem configuration of FIG. 2A in another implementation. That is, either configuration may not be segmented into separate energy absorption cells, or may be segmented into two or more energy absorption cells.

Figure 3A:
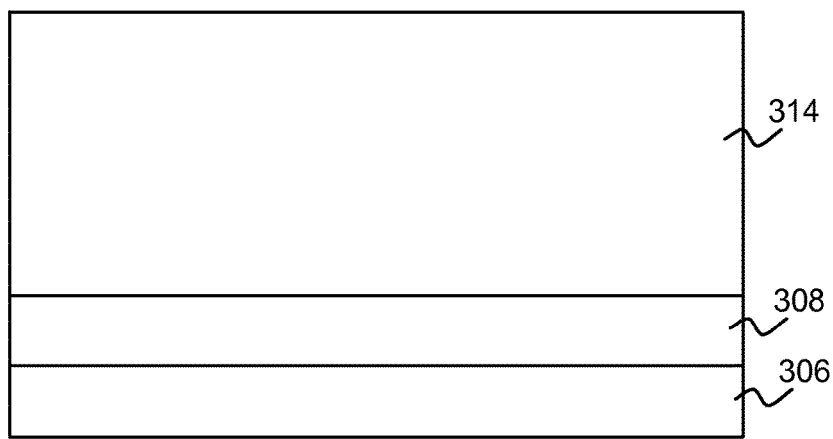
FIG. 3A is a diagram of an example prefabricated thin film energy absorption sheet having an interdigitated electrode contact layer.

FIG. 3A shows an example of a single prefabricated thin film energy absorption sheet 302. The energy absorption sheet 302 can be used in lieu of any of the energy absorption sheets 102 that have been described. In the example of FIG. 3A, the energy absorption sheet 302 includes a backside layer 306 like the backside layers 206A, 206B, and 206N that have been described, as well as an energy absorption layer 314 like the energy absorption layers 214A, 214B, and 214N have been described.

However, in FIG. 3A, rather than both a top electrode contact layer and a bottom electrode contact layer, there is one interdigitated electrode contact layer 308. In the example of FIG. 3A, the interdigitated electrode contact layer 308 is shown as a bottom such layer, between the backside layer 306 and the energy absorption layer 314. In another implementation, the interdigitated electrode contact layer 308 can be a top such layer, above the energy absorption layer 314, in which case the energy absorption layer 314 is in direct contact with the backside layer 306.

Figure 3B:
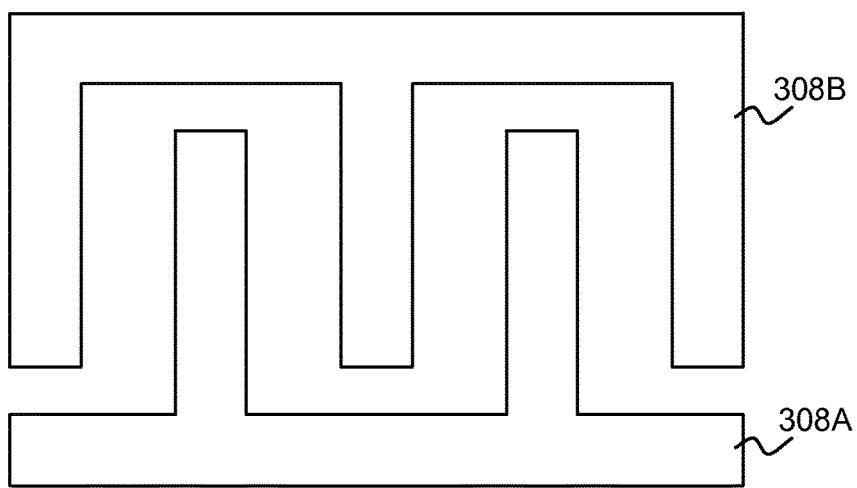
FIG. 3B is a diagram of a plan view of an example interdigitated electrode contact layer.

FIG. 3B shows a plan view of an example of the interdigitated electrode contact layer 308. The interdigitated electrode contact layer 308 has two parts 308A and 308B that are electrically isolated from one another within the layer 308 itself. Having an interdigitated electrode contact layer 308 means that there can be just one electrode contact layer 308 within the prefabricated thin film energy absorption sheet 302. When the interdigitated contact layer 308 is employed, it includes two materials: a first material that forms a rectifying junction in relation to the energy absorption layer 314, and a second material that forms an ohmic contact in relation to the energy absorption layer 314.

FIG. 4 illustratively shows an example roll-to-sheet method 400 for fabricating energy harvesting devices 100 from prefabricated thin film sheets. The method 400 is described in relation to instances of the energy harvesting device 100 of FIG. 1B, but is applicable to the energy harvesting device 100 of FIG. 1A as well. The prefabricated thin film sheets include the energy absorption sheets 102A, 102B, . . . , 102N, the backplane sheet 104 and the battery sheet 108, which have been prefabricated and wound onto corresponding continuous rolls 422A, 422B, . . . , 422N, 424, and 428, respectively.

The rolls 422A, 422B, . . . , 422N, 424, and 428 are unrolled (402) using a roller 414, to result in a thin film sheet stack 430 of the prefabricated thin film sheets 102A, 102B, . . . , 102N, 104, and 108. The thin film sheets 102A, 102B, . . . , 102N, 104, and 108 of the thin film sheet stack 430 are laminated together (430). For example, the thin film sheets 102A, 102B, . . . , 102N, 104, and 108 can be laminated via bonding, or by being adhesively attached together. The via pairs 106, 108, and 110 of FIG. 1B are formed through the thin film sheet stack 430 by drilling (406), and then filled with a conductive material (408), such as by electroplating.

The result of the method 400 from part 402 through part 408 is a thin film sheet stack 430 having multiple energy harvesting devices 100. Therefore, the thin film sheet stack 430 is divided into individual energy harvesting devices 100 (410), such as via singulation. The individual energy harvesting devices 100 can then be encapsulated (i.e., packaged) into separate energy harvesting device modules 432 (412) for use within electronic devices.

FIG. 5 illustratively shows an example roll-to-roll method 500 for fabricating a thin film energy absorption sheet, which can then be used as a prefabricated such sheet in the method 400. The method 500 is described in relation to the thin film energy absorption sheet 102A of FIG. 2A, but is more generally applicable in relation to other types of thin film energy absorption sheets as well. The method 500 starts by unwinding or unrolling a roll 514 of the backside layer 206A (502), which is a substrate layer.

The bottom electrode contact layer 208A can be formed on the backside layer 206A (504). For example, the insulating layer 210A may be deposited as a passivation layer on the backside layer 206A, and the conductive wire network layer 212A formed on or within the insulating layer 210A. In one implementation, formation of the conductive wire network layer 212A can be achieved by depositing a conductive material in accordance with the desired network topology. In another implementation, formation of the conductive wire network layer 212A can be achieved by depositing a sacrificial layer of the conductive material, performing nano imprint lithography to structure the sacrificial layer in correspondence with the desired network topology, and then etching the conductive material to realize the desired network topology. As another example, the bottom electrode contact layer 208A can be formed by depositing a transparent electrode contact layer, which may be interdigitated if the bottom electrode contact layer 208A is the only electrode contact layer of the thin film energy absorption sheet 102A.

The energy absorption layer 214A is formed (506). For example, a semiconducting energy absorbing material may be deposited. The topside electrode contact layer 216A can be formed on the energy absorption layer 214A (508). For example, the topside electrode contact layer 216A can be formed by depositing a transparent electrode contact layer, which may be interdigitated if the topside electrode contact layer 216A is the only electrode contact layer of the thin film energy absorption sheet 102A. The layers 208A, 214A, and 216A can be scribed into segmented energy absorption cells 202A and 204A (510).

The result of the method 500 from part 502 through part 510 is the thin film energy absorption sheet 102A. The thin film energy absorption sheet 102A is wound or rolled into a roll 516 of the thin film energy absorption sheet 102A (512). This roll 516 can then be used as one of the rolls 422A, 422B, . . . , 422N when the method 400 is subsequently performed.

The fabrication of individual thin film energy absorption sheets 102 using a roll-to-roll process and then fabricating a multiple energy absorption sheet energy harvesting device 100 using a roll-to-sheet process addresses the deficiencies with existing solar cells noted above. Solar cell efficiency is improved by providing an energy harvesting device having multiple junctions corresponding to the multiple energy absorption layers of the device. Existing multiple junction solar cells are difficult to manufacture. The techniques disclosed herein by comparison ease manufacture, by fabricating the energy absorption layers prior to manufacture of the energy harvesting device itself, within corresponding thin film energy absorption sheets. Such prefabricated thin film energy absorption sheets are then just mechanically stacked and bonded together to form a multiple energy absorption sheet (i.e., a multiple junction) energy harvesting device.

Furthermore, different types of energy harvesting devices can be easily fabricated by appropriately selecting among different rolls of prefabricated thin film sheets. For example, one application may specify energy absorption sheets tuned to absorb different electromagnetic wavelengths, whereas another application may specify energy absorption sheets tuned to absorb the same electromagnetic wavelength. If the energy harvesting devices are otherwise identical, fabricating the devices for the first application as opposed to the second application can be as straightforward as switching out particular rolls of prefabricated thin film sheets for other rolls.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. An energy harvesting device comprising:
  a plurality of energy absorption cells;
  a backplane sheet that is common to and that is contiguous across the energy absorption cells along a first axis, each energy absorption cell extending along a second axis perpendicular to the first axis;
  a plurality of prefabricated thin film energy absorption sheets attached to the backplane sheet, each energy absorption sheet segmented in accordance with the energy absorption cells along the first axis, each energy absorption cell encompassing a segment of each energy absorption sheet, the thin film energy absorption sheets organized in a stack, including a top sheet, a last-from-bottom sheet, and a bottom sheet, each energy absorption sheet attached to at least one other of the energy absorption sheets and comprising:

an energy absorption layer segmented along the first axis in accordance with the energy absorption cells and made of a semiconductive material absorbing electromagnetic energy, segmentation of the energy absorption layer along the first axis defining gaps between adjacent energy absorption cells;

a top electrode contact layer and a bottom electrode contact layer, both the top and bottom electrode contact layers segmented along the first axis in accordance with the energy absorption cells and in contact with the energy absorption layer; and a backside layer that is common to and that is contiguous across the energy absorption cells along the first axis; and a plurality of pairs of vias, each pair of vias corresponding to a corresponding one of the energy absorption sheets, each pair of vias filled with a conductive material, a first via of each pair of vias extending from the backplane sheet through the stack to the bottom electrode contact layer of the corresponding one of the energy absorption sheets, a second via of each pair of vias extending from the backplane sheet through the stack to the top electrode contact layer of the corresponding one of the energy absorption sheets; wherein within each energy absorption sheet, the top electrode contact layer is physically separated from the bottom electrode contact layer by the gaps between adjacent energy absorption cells, the backside layer of the last-from-bottom sheet is attached to the top electrode contact layer of the bottom sheet, and the backside layer of the bottom sheet is continuously attached to the backplane sheet.

2. The energy harvesting device of claim 1, wherein:

the energy absorption layer of the bottom sheet of the plurality of energy absorption sheets absorbs electromagnetic energy of red visible light wavelength;

the energy absorption layer of the last-from-bottom sheet of the plurality of energy absorption sheets absorbs electromagnetic energy of green visible light wavelength; and the energy absorption layer of the top sheet of the plurality of energy absorption sheets absorbs electromagnetic energy of blue visible light wavelength.

\* \* \* \* \*